United States Patent
Cook et al.

[19]

[11] Patent Number: 6,124,742
[45] Date of Patent: Sep. 26, 2000

[54] WIDE BANDWIDTH FREQUENCY MULTIPLIER

[75] Inventors: Dean Cook, Mesa; Christopher D. Grondahl, Chandler, both of Ariz.

[73] Assignee: Motorola, Inc., Schaumburg, Ill.

[21] Appl. No.: 09/013,234

[22] Filed: Jan. 26, 1998

[51] Int. Cl.[7] .................................................. H03B 19/00
[52] U.S. Cl. ........................................ 327/119; 327/116
[58] Field of Search ........................... 327/116, 119–122; 377/47, 48

[56] References Cited

U.S. PATENT DOCUMENTS

| | | | |
|---|---|---|---|
| 3,839,685 | 10/1974 | Borsa et al. | 331/114 |
| 4,308,473 | 12/1981 | Carnes | 327/113 |
| 4,342,008 | 7/1982 | Jewett | 331/49 |
| 4,749,950 | 6/1988 | Farkas | 327/173 |
| 5,563,612 | 10/1996 | Flood et al. | 342/385 |

OTHER PUBLICATIONS

A balanced millimeter wave doubler based on pseudomorphic HEMTS. Authors—I. Angelov, H. Zirath, N. Rorsman, H. Gronqvist. Chalmers University of Technology, S–41296 Gotteborg, Sweden. 1992 IEEE MTT–S Digest.

180° Lumped Element Hybrid. Author—Samuel J. Parisi, The MITRE Corporation. Bedford, Massachusetts. 1992 IEEE MTT–S Digest.

*Primary Examiner*—Kenneth B. Wells
*Attorney, Agent, or Firm*—Gregory J. Gorrie

[57] ABSTRACT

A wide bandwidth frequency multiplier (48) multiplies a first frequency of an input signal (52) to generate an output signal (54) having a second frequency. The multiplier (48) includes first stage doubler (56). The doubler (56) includes a lumped element power splitter (62), a push-push amplifier (80), and a combining junction (96). The power splitter (62) splits the input signal (52) into first and second signals (70, 72) that are balanced in phase. A series resistive element (86) maintains amplitude balance between the first and second signals (70, 72). First and second feedback circuits (166, 184) are integrated with first and second transistors (164, 182) so that the push-push amplifier (80) operates over wide bandwidth. In addition, the multiplier (48) includes a second stage doubler (58) configured similar to the first stage doubler (56) for producing an output signal (54) that is quadruple the frequency of input signal (52). The first and second stage doublers (56, 58) are combined on a single integrated circuit.

21 Claims, 4 Drawing Sheets

48

-PRIOR ART-

WIDE BANDWIDTH FREQUENCY MULTIPLIER

FIELD OF THE INVENTION

The present invention relates generally to frequency multipliers and in particular, to wide bandwidth frequency multipliers.

BACKGROUND OF THE INVENTION

Frequency multipliers have been used in many applications for increasing the frequency of an input signal. Generally, a frequency multiplier is a harmonic conversion transducer for producing an output signal at a frequency that is an integral multiple of the fundamental frequency of the input signal.

A typical goal of frequency multipliers is to minimize conversion loss while providing sufficient harmonic rejection. Conversion loss is the amount of power lost in the input signal during the conversion of an input signal to an output signal. In addition, frequency multipliers, such as doublers, desirably produce an output signal that is a second harmonic frequency of the fundamental frequency of the input signal. When harmonic rejection is not sufficient, the resulting output signal may include odd harmonics which tend to dissipate power, cause signal distortion, and decrease efficiency.

In applications where the frequency of a signal may change or the frequency of the signal is unknown, a multiplier circuit that can provide frequency multiplication over a wide range of frequencies is highly desirable. Using the same multiplier circuit for several frequency multiplication activities decreases circuit costs associated with redesign, retooling, and a large inventory of multiple components with similar functions. In addition, many industries, such as the radar and microwave communication industries, are demanding miniaturized components for applications where space and power is limited.

Conventional diode multipliers realize power loss, in the order of 6 dB, so that the power of the input signal may be as much as four times the power of the output signal. Thus, in order to produce an output signal having an output power that is the same as the input power of the input signal, additional amplifier stages may be needed. Unfortunately, additional amplifier stages are undesirable in applications where space and power is limited.

Like diode multipliers, conventional single-ended non-linear multipliers also suffer from conversion loss. In addition, single-ended multipliers do not have effective harmonic rejection. This is a problem in applications where even harmonics are desired, for example in, frequency doublers. When harmonic rejection is ineffective, the resulting output signal of the single-ended non-linear multiplier may include odd harmonics which tend to dissipate power, cause signal distortion, and decrease efficiency.

Conventional push-push multipliers provide harmonic rejection. One conventional push-push multiplier is realized by combining a power splitter and a push-push amplifier which includes two transistors. The power splitter splits an input signal into two signals which are 180° out of phase. The two signals are then amplified by the two transistors which are driven in phase opposition (i.e. 180° out of phase). At the output of the transistors, the fundamental and other odd harmonic frequencies have opposite phase, and destructive interference cancels these frequency components. In addition, the second harmonic frequency signals have the same phase, and therefore interferes constructively to produce an output signal that is rich in second harmonic with low harmonics.

In order for the prior art push-push amplifier to achieve frequency multiplication with minimal conversion loss and distortion, the two signals produced by the power splitter are desirably well balanced both in amplitude and phase. The words "balanced" and "unbalanced" as used herein have meanings that are well-recognized in the art. A balanced signal has another signal which is instantaneously equal and opposite to it with respect to power and phase. An unbalanced signal lacks another such balancing wave. For instance the power, or amplitude, of the two signals may not be the same, or one of the signals may lag in phase relative to the other. Unbalanced signals input into the push-push multiplier cause conversion loss and signal distortion of the output signal.

Conventional power splitters employed with push-push amplifiers include quadrature splitters, distributed element hybrid splitters, and lumped element hybrid splitters. A typical quadrature splitter effectively splits an input signal into two signals that are one hundred and eighty degrees out of phase. Unfortunately, the quadrature splitter is relatively large thus not usable in applications where space is limited. Distributed element hybrid splitters also consume too much space at frequencies below millimeter wavelengths to be cost-effective. Furthermore, distributed element hybrid splitters operate over a narrow bandwidth, thus being unusable in applications where a wide frequency bandwidth is desired.

FIG. 1 shows a block diagram of a prior art lumped element hybrid splitter 20. Lumped element splitter 20 has an input terminal 22 for receiving an input signal 24. Lumped element splitter 20 also includes a first output terminal 26 and a second output terminal 28. A first signal 32 is output at first output terminal 26 and a second signal 34 is output at second output terminal 28. A leg 36 is configured to impose a substantially ninety degree phase lag on first signal 32, while a leg 38 is configured to impose a substantially two hundred and seventy degree phase lag on second signal 34.

Legs 36 and 38 are formed with lumped elements, such as capacitors and inductors (not shown) to produce the phase lags. The imposed phase lags produce a resulting phase difference between first and second signals 32 and 34, respectively, of one hundred and eighty degrees.

An inherent consequence of the operations of lumped element hybrid splitter 20 is that one of first and second signals 32 and 34, respectively will have more power loss than the other. In other words, splitter 20 does not produce first and second signals 32 and 34, respectively, that have balanced amplitudes. The unbalanced first and second signals 32 and 34 cause conversion loss and signal distortion when further processed by the two transistors of the push-push amplifier.

Another problem with splitter 20 lies in its configuration. A conventional layout of splitter 20 results in first and second output terminals 26 and 28, respectively, being at opposite diagonal corners relative to one another. Hence, a first transmission path 40 from first output terminal 26 to a first transistor input 42 of the push-push amplifier will be a different in length than a second transmission path 44 from second output terminal 28 to a second transistor input 46. First and second transmission paths 40 and 44, respectively, impose a phase delay on first and second signals 32 and 34, respectively, relative to the length of the transmission path.

Therefore, if the lengths of first and second transmission paths 40 and 44 are different, the respective phase lags are different, thus producing first and second signals 32 and 34 that are unbalanced in phase at first and second transistor inputs 42 and 46. This unbalanced phase also causes conversion loss and distortion of the output signal.

Typical push-push amplifiers of a frequency multiplier have a high quality factor (Q) so as to desirably minimize power dissipation, or conversion loss. However, a high Q results in a multiplier circuit that operates over a narrow bandwidth. Although a high Q is desirable, a problem lies with operation of a push-push amplifier over a narrow bandwidth. Such a push-push amplifier may not have the capability to sweep over a range of frequencies and therefore the same push-push amplifier may not be usable in multiple applications. As discussed previously, multiple components with similar functions undesirably drive up system costs.

In order to meet the needs of system miniaturization to comply with space and cost constraints, the power splitter and push-push amplifier of a frequency multiplier may desirably be incorporated onto a single integrated circuit. However, conventional frequency multipliers are not suitable for integration in an integrated circuit due to large size and excessively narrow bandwidth operations.

Thus what is needed is an improved apparatus for processing an input signal having a first frequency to generate an output signal having a second frequency. Furthermore, what is needed is an apparatus that minimizes conversion loss and signal distortion. Furthermore, what is needed is an apparatus that is operable over a wide frequency bandwidth. In addition, what is needed is an apparatus that is readily miniaturized, power efficient, and low cost.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 2:
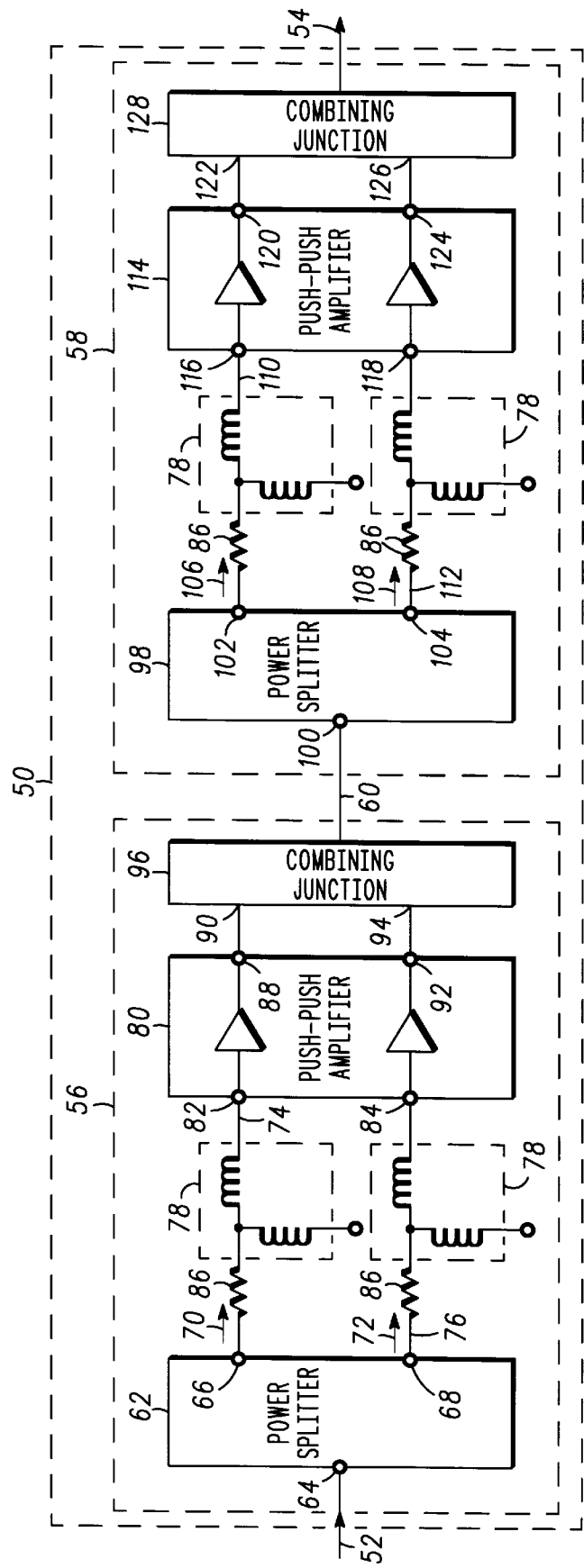
FIG. 2 is a block diagram of a wide bandwidth frequency multiplier in accordance with a preferred embodiment of the present invention.

FIG. 2 is a block diagram of a wide bandwidth frequency multiplier 48 in accordance with a preferred embodiment of the present invention. Frequency multiplier 48 is integrated on a single microwave monolithic integrated circuit (MMIC) 50. MMIC 50 is a compact, low power integrated circuit that is readily adapted to systems with limited space and power constraints.

Frequency multiplier 48 is configured to process an input signal 52 having a fundamental frequency to generate an output signal 54 having a second frequency. In the preferred embodiment, frequency multiplier 48 quadruples the fundamental frequency of input signal 52 so that the frequency of output signal 54 is four times the frequency of input signal 52.

Input signal 52 has a frequency that is greater than approximately 1 GHz. For example, input signal 52 may have a frequency of 3 GHz so that frequency multiplier 48 generates output signal 54 having a frequency up to 12 GHz. However, other applications for frequency multiplier 48 may include any microwave or millimeter-wave systems that desire frequency multiplication at power levels that are compatible with the design of MMIC 50.

Frequency multiplier 48 includes a first stage frequency doubler 56 and a second stage frequency doubler 58. First stage frequency doubler 56 is configured to receive input signal 52 at an input frequency and provide an intermediate signal 60 having twice the frequency of input signal 52. Likewise, second stage frequency doubler 58 is configured to receive intermediate signal 60 and provide output signal 54 having twice the frequency of intermediate signal 60 which results in output signal 54 having a frequency that is four times the frequency of input signal 52.

Although frequency multiplier 48 is configured to quadruple the frequency of input signal 52, those skilled in the art will recognize that frequency multiplier 48 may include just one of the frequency doubler stages so as to produce an output signal that is double the frequency of the input signal. Likewise, frequency multiplier 48 may include any number of frequency doubler stages or any number of cascaded MMICs 50 to provide the desired amount of frequency multiplication within the operating bandwidth of the multiplier.

Figure 1:
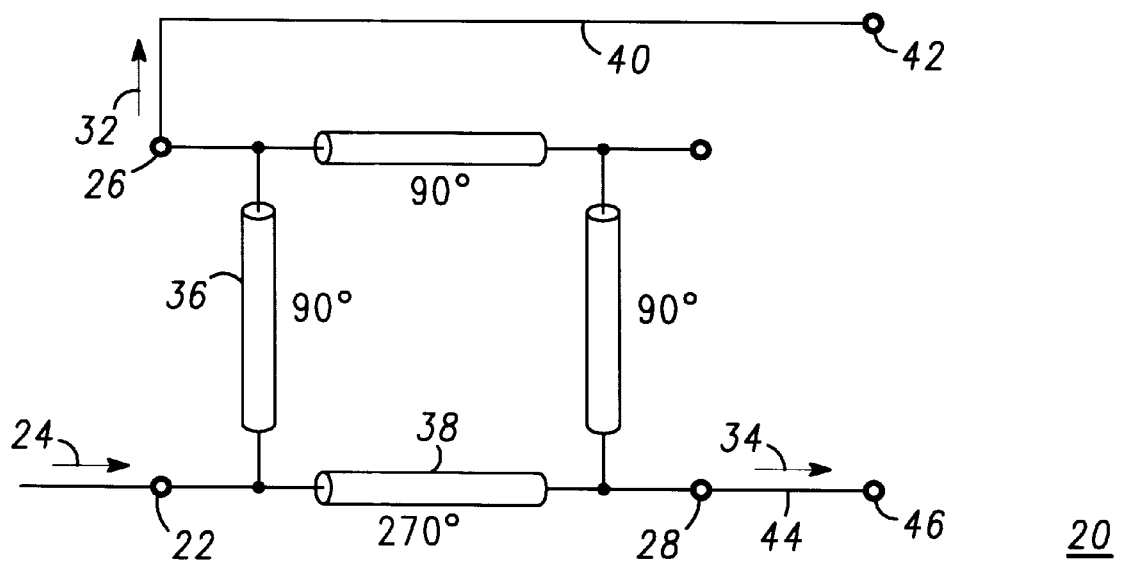
FIG. 1 is a block diagram of a prior art lumped element power splitter.

First stage frequency doubler 56 includes a first stage lumped element power splitter 62. First stage power splitter 62 has an input terminal 64 configured to receive input signal 52. Additionally, first stage power splitter 62 has first and second output terminals 66 and 68, respectively. First output terminal 66 is configured to provide a first signal 70. Likewise, second output terminal 68 is configured to provide a second signal 72. First stage power splitter 62 is a modification of the prior art power splitter 20 (FIG. 1) that alleviates the problems of the unbalanced first and second signals 32 and 34 (FIG. 1) generated by splitter 20.

A first transmission path 74 is coupled to first output terminal 66 and a second transmission path 76 is coupled to second output terminal 68. In the preferred embodiment, first and second transmission paths 74 and 76, respectively, are of substantially equal lengths so that phase lags imposed on first and second signals 70 and 72, respectively, propagating along paths 74 and 76, respectively, are approximately equal.

Input tune and bias elements 78 are coupled to first and second transmission paths 74 and 76. Elements 78 provide tuning and bias connection to the inputs of a first stage push-push amplifier 80. Tune and bias elements 78 are known to those skilled in the art and will not be described in detail herein.

First stage push-push amplifier 80 has first and second amplifier inputs 82 and 84, respectively. First amplifier input 82 is coupled to first transmission path 74 for receiving first signal 70. Likewise, second amplifier input 84 is coupled to second transmission path 76 for receiving second signal 72.

A series element 86 is coupled between second output terminal 68 and input tune and bias element 78 and is configured to attenuate an amplitude for a second signal along path 76 relative to a first signal along path 74. Input tune and bias element 78 is coupled to second amplifier input 84. In an alternative embodiment of the present invention, the attenuation functions performed by element 86 may also be performed by a shunt element.

First stage push-push amplifier 80 has a first amplifier output 88 configured to produce a first amplified signal 90. In addition, amplifier 80 has a second amplifier output 92 configured to produce a second amplified signal 94. A first stage combining junction 96 is coupled to first and second amplifier outputs 88 and 92, respectively. First stage combining junction 96 is configured to combine first and second amplified signals 90 and 94, respectively, in phase to generate intermediate signal 60.

Second stage frequency doubler 58 is configured similar to first stage frequency doubler 56. Second stage doubler 58 includes a second stage lumped element power splitter 98. Second stage power splitter 98 has an input terminal 100 configured to receive intermediate signal 60. Additionally, second stage power splitter 98 has third and fourth output terminals 102 and 104, respectively. Third output terminal 102 is configured to provide a third signal 106. Likewise, fourth output terminal 104 is configured to provide a fourth signal 108.

A third transmission path 110 is coupled to third output terminal 102 and a fourth transmission path 112 is coupled to fourth output terminal 104. Like first and second paths 74 and 76, third and fourth transmission paths 110 and 112, respectively, are of substantially equal lengths.

Input tune and bias elements 78 are coupled to third and fourth transmission paths 110 and 112 to provide tuning and bias connection of the inputs of a second stage push-push amplifier 114.

Second stage push-push amplifier 114 has third and fourth amplifier inputs 116 and 118, respectively. Third amplifier input 116 is coupled to third transmission path 110 for receiving third signal 106. Likewise, fourth amplifier input 118 is coupled to fourth transmission path 112 for receiving fourth signal 108. As in first stage frequency doubler 56, a series element 119 is coupled between fourth output terminal 104 and input tune and bias element 78 which is coupled to fourth amplifier input 118.

Second stage push-push amplifier 114 has a third amplifier output 120 configured to produce a third amplified signal 122. In addition, amplifier 114 has a fourth amplifier output 124 configured to produce a fourth amplified signal 126. A second stage combining junction 128 is coupled to third and fourth amplifier outputs 120 and 124, respectively. Second stage combining junction 128 is configured to combine third and fourth amplified signals 122 and 126, respectively, in phase to generate output signal 54.

Figure 3:
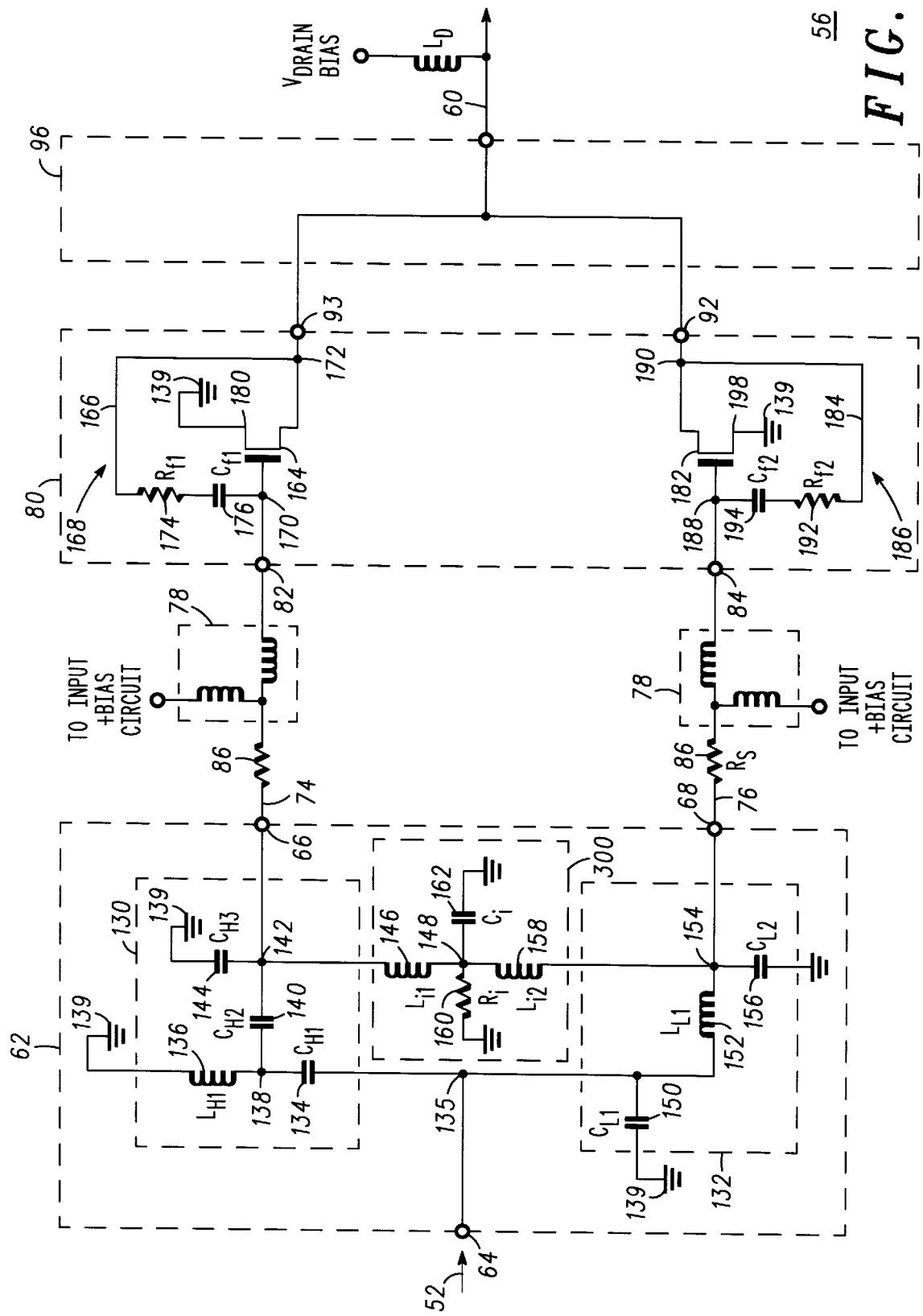
FIG. 3 is an electrical schematic of a first stage frequency doubler of the wide bandwidth frequency multiplier in accordance with a preferred embodiment of the present invention.

FIG. 3 is an electrical schematic of first stage doubler 56 of wide bandwidth frequency multiplier 48 in accordance with a preferred embodiment of the present invention. It should be readily apparent to those skilled in the art that second stage doubler 58 is functionally equivalent to first stage doubler 56 with different component values to accommodate double the frequency, therefore the following discussion pertains to either of doublers 56 and 58.

Power splitter 62 includes high-pass section 130, low-pass section 132, and isolation section 300. High-pass and low-pass sections 130 and 132, respectively, and isolation section 300 are preferably configured with lumped elements, for example capacitors and inductors (discussed below), interconnected by transmission lines. Other configurations are also suitable.

High-pass section 130 of power splitter 62 includes a first high-pass capacitor ($C_{H1}$) 134 coupled to input terminal 64 at a junction 135. A first high-pass inductor ($L_{H1}$) 136 has an input coupled at a junction 138 to an output of $C_{H1}$ 134 and has an output coupled to a system ground 139. A second high-pass capacitor ($C_{H2}$) 140 has an input coupled at junction 138 to $C_{H1}$ 134 and has an output coupled at a junction 142 to first output terminal 66. A third high-pass capacitor ($C_{H3}$) 144 is coupled to the output of $C_{H2}$ 140 at junction 142 and has an output coupled to system ground 139.

Low-pass section 132 of power splitter 62 includes a first low-pass capacitor ($C_{L1}$) 150 coupled to input terminal 64 at junction 135 and has an output coupled to system ground 139. A first low-pass inductor ($L_{L1}$) 152 has an input coupled to input terminal 64 at junction 135 and has an output coupled to second output terminal 68 at a junction 154. A second low-pass capacitor ($C_{L2}$) 156 is coupled to the output of $L_{L1}$ 152 at junction 154 and has an output coupled to system ground 139.

Lumped element power splitter 62 is configured to operate over a wide frequency bandwidth. By judicious selection of values for $C_{H1}$ 134, $L_{H1}$ 136, $C_{H2}$ 140, $C_{H3}$ 144, $C_{L1}$ 150, $L_{L1}$ 152, and $C_{L2}$ 156, using computerized design aids in a manner well known by those skilled in the art, a gain value remains flat for frequencies within the operating bandwidth of splitter 62. Hence, the amount of gain imparted on input signal 52 by splitter 62 as input signal 52 is split into first and second signals 70 and 72, respectively, (FIG. 2) will be the approximately the same at all frequencies within the operating bandwidth of splitter 62.

In one preferred embodiment of the present invention, isolation section 300 includes a first isolation inductor ($L_{i1}$) 146, isolation resistor ($R_i$) 160, isolation capacitor ($C_i$) 162 and second isolation inductor ($L_{i2}$) coupled together at terminal 148. First isolation inductor ($L_{i1}$) 146 is coupled to high-pass section 130 at junction 142. Second isolation inductor ($L_{i2}$) 158 is coupled to low-pass section 132 at junction 154. Isolation resistor ($R_i$) 160 and isolation capacitor ($C_i$) 162 are coupled to system ground 139. Desirably, isolation resistor ($R_i$) 160 provides a termination for signal reflections between first and second output terminals 66 and 68 respectively. Isolation resistor ($R_i$) 160 preferably has a nominal value of 50 ohms. The values of first isolation inductor ($L_{i1}$) 146, isolation resistor ($R_i$) 160, isolation capacitor ($C_i$) 162 and second isolation inductor ($L_{i2}$) are selected to provide isolation between terminals 66 and 68. $C_{L2}$ 156 of high pass section 132 and $C_{H3}$ 144 of low pass section 130 also affect the isolation and their values are set accordingly.

Referring to series element 86, series element 86 is a series resistor ($R_S$) coupled between second output terminal 68 and second amplifier input 84. Generally, first signal 70 (FIG. 2), produced by high-pass section 130 is more lossy than second signal 72 (FIG. 2) produced by low-pass section 132. In other words, first signal 70 at first output terminal 66 will have a lower amplitude than second signal 72 at second output terminal 68. $R_S$ 86 is configured to attenuate the amplitude of second signal 72 relative to first signal 70 so that the amplitude of first and second signals 70 and 72 are substantially balanced.

Referring to push-push amplifier 80, a first field effect transistor 164 and a first feedback circuit 166 combine to form a first portion 168 of push-push amplifier 80. First transistor 164 has a first transistor gate input 170 coupled to first amplifier input 82 for receiving first signal 70 (FIG. 2). In addition, first transistor 164 has a first transistor drain output 172 coupled to first amplifier output 88 for providing first amplified signal 90 (FIG. 2). First feedback circuit 166 is electrically connected between first transistor gate input 170 and first transistor drain output 172. First feedback circuit 166 includes a feedback resistor ($R_{F1}$) 174 and a feedback capacitor ($C_{F1}$) 176 in series. First transistor 164 also has a source coupled to system ground 139 at a junction 180.

A second field effect transistor 182 and a second feedback circuit 184 combine to form a second portion 186 of push-push amplifier 80. Second transistor 182 has a second transistor gate input 188 coupled to second amplifier input 84 for receiving second signal 72 (FIG. 2). In addition, second transistor 182 has a second transistor drain output 190 coupled to second amplifier output 92 for providing second amplified signal 94 (FIG. 2). Second feedback circuit 184 is electrically connected between second transistor gate input 188 and second transistor drain output 190. Second feedback circuit 184 includes a series connected feedback resistor ($R_{F2}$) 192 and a feedback capacitor ($C_{F2}$) 194. Finally second transistor 182 has a source coupled to system ground 139 at a junction 198. Transistors 164 and 182 are field effect transistors in the preferred embodiment. However, those skilled in the art will recognize that transistors 164 and 182 may be bipolar transistors. Inductor $L_d$ couples the drains of FETs 164 and 182 with a drain bias voltage.

First and second portions 168 and 186, respectively, provide gain to first and second signals 70 and 72, respectively, (FIG. 2) to maintain a low conversion loss. First and second portions 168 and 186 form a push-push pair of push-push amplifier 80. First and second transistors 164 and 182, respectively, are preferably driven substantially one hundred and eighty degrees out of phase by power splitter 62 and the transistors are biased to have a conduction angle of approximately one hundred and eighty degrees. First and second amplified signals 90 and 94, respectively, (FIG. 2) produced by push-push amplifier 80 are combined in combining junction 96. Hence, the resulting waveform of intermediate signal 60 resembles a full-wave rectified sine wave that is rich in second-harmonic and has low harmonics.

First and second feedback circuits 166 and 184, respectively, causes a reduction in the input Q, or quality factor. A reduced Q results in an increased operating bandwidth of amplifier 80 over conventional push-push amplifiers. This greater bandwidth allows wide bandwidth frequency multiplier 48 to sweep through a large range of frequencies so that multiplier 48 may used for different parts of the same system thus reducing system cost and complexity.

Figure 4:
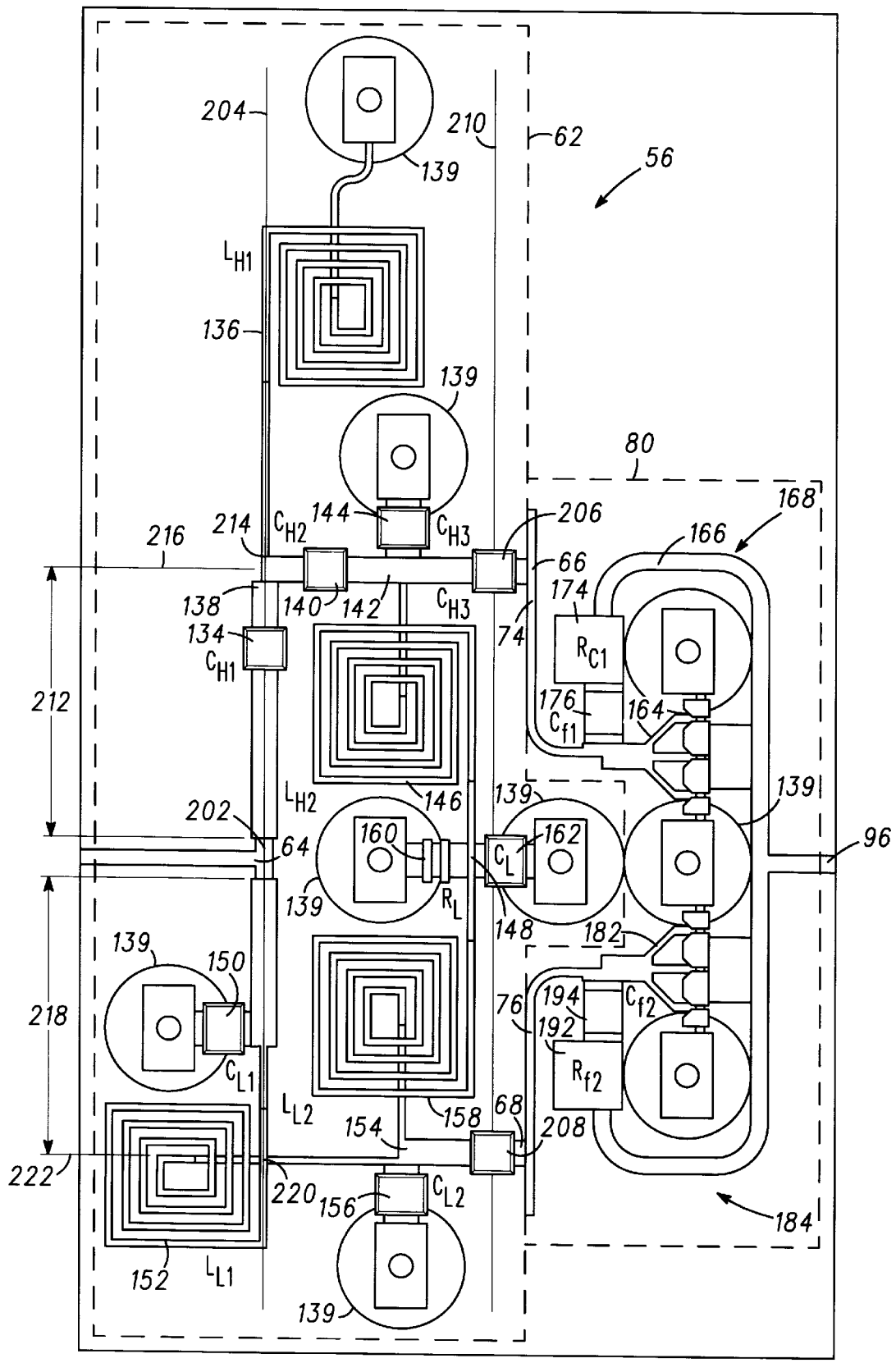
FIG. 4 is an illustration of a topology of the first stage frequency doubler in accordance with a preferred embodiment of the present invention.

FIG. 4 is an illustration of a topology 200 of first stage doubler 56 in accordance with a preferred embodiment of the present invention. As previously discussed, first and second stage doublers 56 and 58, respectively are integrated on MMIC 50 (FIG. 2). Topology 200 is an exemplary layout for the miniaturization of first stage doubler 56. It should be readily apparent to those skilled in the art that since second stage doubler 58 is functionally equivalent to first stage doubler 56, topology 200 may be applied to second stage doubler 58. Therefore, the following discussion pertains to either of doublers 56 and 58.

Power splitter 62 includes transmission lines arranged in approximately perpendicular columns and rows on a semiconductor substrate, or MMIC 50 (FIG. 2). Input terminal 64 is located proximate a center point 202 of a first column 204. First and second output terminals 66 and 68, respectively, are located at first and second end points 206 and 208, respectively, of a second column 210. Isolation terminal 148 is centrally located between end points 206 and 208 of second column 210.

$C_{H1}$ 134 is located along a high-pass section 212 of first column 204 and junction 138 is located at an end point 214 of high-pass section 212. $C_{H2}$ 140 and junction 142 are located in a first row 216, and end point 206 of second column 210 is located at the intersection of first row 216 and second column 210. $C_{L1}$ 150 is located proximate a low-pass section 218 of first column 204 and $L_{11}$ 152 is located at an end point 220 of low-pass section 218. Junction 154 is located in a second row 222 and end point 208 is located at the intersection of second row 222 and second column 210. The layout of power splitter 62 is configured for compactness and ease of integration on a single MMIC 50.

First and second transmission paths 74 and 76 impose phase lags on first and second signals 70 and 72, respectively, (FIG. 2). However, as shown in topology 200, second path 76 is substantially a mirror image of first path 74. In other words, paths 74 and 76 are equal and opposite in layout. Thus, the phase lags imposed on first and second signals 70 and 72 are approximately equal so as to maintain balance of phase between signals 70 and 72.

First and second portions 168 and 186, respectively, of push-push amplifier 80 likewise affect the phase of first and second signals 70 and 72 when producing first and second amplified signals 90 and 94, respectively (FIG. 2). However, as shown in topology 200, second portion 186 is substantially a mirror image of first portion 168. Like paths 74 and 76, first and second portions 168 and 186 are equal and opposite in layout to maintain phase balance between signals 70 and 72 as first and second amplified signals 90 and 94 are produced. Like power splitter 62, the layout of amplifier 80 is configured for compactness and ease of integration on a single MMIC 50.

Exemplary topology 200 is provided to illustrate the mirror image of transmission paths 74 and 76, as well as first and second portions 168 and 186 of amplifier 80 in order to draw attention to the techniques used to maintain balance of phase between first and second signals 70 and 72. Additional elements such as input tune and bias elements 78 and series element 86 are not shown in topology 200 in order to simply the illustration of topology 200. It should be realized, however, that elements 78 and series element 86 are also formed on MMIC 50.

In summary, a wide bandwidth frequency multiplier is provided for processing an input signal having a fundamental frequency to generate a second signal that is quadruple in frequency of the fundamental frequency. The wide bandwidth multiplier minimizes conversion loss and signal distortion by maintaining signal balance of the split signals. Balance is maintained by the incorporation of a series resistor element to maintain power balance between the split signals, and by the incorporation of transmission lines and paths of equal lengths to balance phase lag between the split signals. The wide bandwidth frequency multiplier operates over a wide frequency bandwidth by judicious selection of the lumped elements of the power splitter and by the incorporation of feedback loops for each of the transistors in a push-push amplifier. Finally, the multiplier circuit is integrated onto a single integrated circuit for power, space, and cost efficiency.

Although the preferred embodiments of the invention have been illustrated and described in detail, it will be readily apparent to those skilled in the art that various modifications may be made therein without departing from the spirit of the invention or from the scope of the appended claims. For example, circuit layout may be modified and yet still fit in an integrated circuit. Furthermore, other current and emerging semiconductor technologies such gallium arsenide may be employed.

What is claimed is:

1. A wide bandwidth frequency multiplier for processing an input signal having a first frequency to generate an output signal having a second frequency, said wide bandwidth frequency multiplier comprising:
   a lumped element power splitter having an input terminal configured to receive said input signal and having first and second output terminals, said lumped element power splitter being configured to split said input signal into first and second signals that are substantially one hundred and eighty degrees out of phase;
   a first transmission path coupled to said first output terminal, said first transmission path imposing a first phase lag on said first signal;
   a second transmission path coupled to said second output terminal, said second transmission path imposing a second phase lag on said second signal, wherein said first and second transmission paths have substantially equal lengths such that said first and second phase lags are approximately equal;
   a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals, said first and second amplified signals being substantially in-phase; and
   a combining junction coupled to said first and second push-push amplifier outputs and configured to in-phase combine said first and second amplified signals to generate said output signal having said second frequency.

2. A wide bandwidth frequency multiplier as claimed in claim 1 wherein said power splitter operates over a frequency bandwidth, and said power splitter comprises:
   a high-pass section, a low-pass section and an isolation section for establishing said frequency bandwidth, said high-pass, low-pass and isolation sections being configured with lumped elements interconnected by transmission lines.

3. A wide bandwidth frequency multiplier for processing an input signal having a first frequency to generate an output signal having a second frequency, said wide bandwidth frequency multiplier comprising:
   a lumped element power splitter having an input terminal configured to receive said input signal and having first and second output terminals, said lumped element power splitter being configured to split said input signal into first and second signals that are substantially one hundred and eighty degrees out of phase;
   a first transmission path coupled to said first output terminal, said first transmission path imposing a first phase lag on said first signal;
   a second transmission path coupled to said second output terminal, said second transmission path imposing a second phase lag on said second signal, wherein said first and second transmission paths have substantially equal lengths such that said first and second phase lags are approximately equal;
   a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals; and
   a combining junction coupled to said first and second push-push amplifier outputs and configured to combine said first and second amplified signals to generate said output signal having said second frequency,
   wherein said power splitter further comprises an isolation terminal coupled between said first and second output terminals, said isolation terminal being terminated to provide isolation between said first and second output terminals.

4. A wide bandwidth frequency multiplier for processing an input signal having a first frequency to generate an output signal having a second frequency, said wide bandwidth frequency multiplier comprising:
   a lumped element power splitter having an input terminal configured to receive said input signal and having first and second output terminals, said lumped element power splitter being configured to split said input signal into first and second signals that are substantially one hundred and eighty degrees out of phase;
   a first transmission path coupled to said first output terminal, said first transmission path imposing a first phase lag on said first signal;
   a second transmission path coupled to said second output terminal, said second transmission path imposing a second phase lag on said second signal, wherein said first and second transmission paths have substantially equal lengths such that said first and second phase lags are approximately equal;
   a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals; and
   a combining junction coupled to said first and second push-push amplifier outputs and configured to combine said first and second amplified signals to generate said output signal having said second frequency,
   wherein:
      said power splitter includes transmission lines arranged in columns and rows on a semiconductor substrate;
      said input terminal is coupled to a center point of a first one of said columns;
      said first and second output terminals defining end points of a second one of said columns; and
      an isolation terminal of said power splitter is centrally located between said end points of said second column.

5. A wide bandwidth frequency multiplier as claimed in claim 4 wherein said power splitter comprises:
   a first high-pass capacitor coupled to said input terminal and located along a high-pass section of said first column;
   a high-pass inductor having an input coupled to an output of said first high-pass capacitor, said input located at an end point of said high-pass section of said first column;
   a second high-pass capacitor having an input coupled to said first high-pass capacitor and having an output coupled to said first output terminal, said second high-pass capacitor being located in a first one of said rows;

a third high-pass capacitor coupled to said output of said second high-pass capacitor;

a first isolation inductor coupled to said output of said second high-pass capacitor and having an output coupled to said isolation terminal;

a first low-pass capacitor coupled to said input terminal;

a low-pass inductor having an input coupled to said input terminal and having an output coupled to said second output terminal, said first low-pass inductor being located at an end point of said low-pass section of said first column;

a second low-pass capacitor coupled to said output of said first low-pass inductor;

a second isolation inductor having an input coupled to said output of said first low-pass inductor and having an output coupled to said isolation terminal;

an isolation resistor coupled to said isolation terminal; and an isolation capacitor coupled to said isolation terminal.

6. A wide bandwidth frequency multiplier as claimed in claim 4 wherein said columns are approximately perpendicular to said rows.

7. A wide bandwidth frequency multiplier for processing an input signal having a first frequency to generate an output signal having a second frequency, said wide bandwidth frequency multiplier comprising:

a lumped element power splitter having an input terminal configured to receive said input signal and having first and second output terminals, said lumped element power splitter being configured to split said input signal into first and second signals that are substantially one hundred and eighty degrees out of phase;

a first transmission path coupled to said first output terminal, said first transmission path imposing a first phase lag on said first signal;

a second transmission path coupled to said second output terminal, said second transmission path imposing a second phase lag on said second signal, wherein said first and second transmission paths have substantially equal lengths such that said first and second phase lags are approximately equal;

a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals;

a combining junction coupled to said first and second push-push amplifier outputs and configured to combine said first and second amplified signals to generate said output signal having said second frequency; and an attenuator network coupled between said second output terminal and said second amplifier input, said attenuator network being configured to attenuate an amplitude for said second signal relative to said first signal so that said first and second signals are substantially balanced.

8. A wide bandwidth frequency multiplier as claimed in claim 7 wherein the attenuator network comprises a series element coupled between said second output terminal and said second amplifier input, said series element being configured to attenuate an amplitude for said second signal relative to said first signal so that said first and second signals are substantially balanced.

9. A wide bandwidth frequency multiplier as claimed in claim 7 wherein the attenuator network comprises a shunt element coupled between said second output terminal and said second amplifier input, said shunt element being configured to attenuate an amplitude for said second signal relative to said first signal so that said first and second signals are substantially balanced.

10. A wide bandwidth frequency multiplier as claimed in claim 7 wherein said power splitter operates over a frequency bandwidth, and said power splitter comprises:

a high-pass section coupled between said input terminal and said first output terminal, said high-pass section producing said first signal; and a low-pass section coupled between said input terminal and said second output terminal, said low-pass section producing said second signal; and said series element attenuates said second signal produced by said low-pass section.

11. A wide bandwidth frequency multiplier for processing an input signal having a first frequency to generate an output signal having a second frequency, said wide bandwidth frequency multiplier comprising:

a lumped element power splitter having an input terminal configured to receive said input signal and having first and second output terminals, said lumped element power splitter being configured to split said input signal into first and second signals that are substantially one hundred and eighty degrees out of phase;

a first transmission path coupled to said first output terminal, said first transmission path imposing a first phase lag on said first signal;

a second transmission path coupled to said second output terminal, said second transmission path imposing a second phase lag on said second signal, wherein said first and second transmission paths have substantially equal lengths such that said first and second phase lags are approximately equal;

a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals; and a combining junction coupled to said first and second push-push amplifier outputs and configured to combine said first and second amplified signals to generate said output signal having said second frequency, wherein said push-push amplifier comprises:

a first transistor having a first transistor input and a first transistor output;

a first feedback circuit electrically connected between said first transistor input and said first transistor output;

a second transistor having a second transistor input and a second transistor output;

a second feedback circuit electrically connected between said second transistor input and said second transistor output; and an isolation section for providing isolation between the first and second output terminals.

12. A wide bandwidth frequency multiplier as claimed in claim 11 wherein:

said first transistor and said first feedback circuit combine to form a first portion of said push-push amplifier; and said second transistor and said second feedback circuit combine to form a second portion of said push-push amplifier, said second portion imposing an approximately equal phase lag as said first portion.

13. A wide bandwidth frequency multiplier as claimed in claim 11 wherein:

said first transistor is configured to amplify said first signal;

said second transistor is configured to amplify said second signal; and said combining junction is configured to combine said first and second amplified signals in phase to produce said output signal.

14. A wide bandwidth frequency multiplier for processing an input signal having a first frequency to generate an output signal having a second frequency, said wide bandwidth frequency multiplier comprising:

a lumped element power splitter having an input terminal configured to receive said input signal and having first and second output terminals, said lumped element power splitter being configured to split said input signal into first and second signals that are substantially one hundred and eighty degrees out of phase;

a first transmission path coupled to said first output terminal, said first transmission path imposing a first phase lag on said first signal;

a second transmission path coupled to said second output terminal, said second transmission path imposing a second phase lag on said second signal, wherein said first and second transmission paths have substantially equal lengths such that said first and second phase lags are approximately equal;

a push-push amplifier having first and second amplifier inputs, said first amplifier input being coupled to said first transmission path for receiving said first signal, said second amplifier input coupled to said second transmission path for receiving said second signal, and said push-push amplifier having first and second outputs configured to produce first and second amplified signals; and a combining junction coupled to said first and second push-push amplifier outputs and configured to combine said first and second amplified signals to generate said output signal having said second frequency, wherein said power splitter is a first stage power splitter, said push-push amplifier is a first stage push-push amplifier, said combining junction is a first stage combining junction, said output signal is an intermediate signal, and said multiplier further comprises:

a second stage lumped element power splitter having a second stage input terminal coupled to said first stage combining junction and having third and fourth output terminals, said second stage input terminal being configured to receive said intermediate signal, and said second stage power splitter being configured to split said intermediate signal into third and fourth signals that are substantially one hundred and eighty degrees out of phase;

a third transmission path coupled to said third output terminal, said third path imposing a third phase lag on said third signal;

a fourth transmission path coupled to said fourth output terminal, said fourth path imposing a fourth phase lag on said fourth signal, wherein said third and fourth paths have substantially equal lengths such that said third and fourth phase lags are approximately equal;

a second stage push-push amplifier having third and fourth amplifier inputs, said third amplifier input coupled to said third path for receiving said third signal, said fourth amplifier input coupled to said fourth path for receiving said fourth signal, said second stage push-push amplifier having third and fourth outputs configured to produce third and fourth amplified signals; and a second stage combining junction coupled to said third and fourth push-push amplifier outputs and configured to combine said third and fourth amplified signals in phase to generate an output signal having a third frequency.

15. A wide bandwidth frequency multiplier as claimed in claim 3 wherein said multiplier is integrated on a single microwave monolithic integrated circuit.

16. A wide bandwidth frequency multiplier as claimed in claim 3 wherein said first frequency is greater than approximately 1 GHz, and said second frequency is double said first frequency.

17. A wide bandwidth frequency multiplier, said multiplier comprising:

a lumped element power splitter, said power splitter having an input terminal, an isolation terminal, and first and second output terminals, wherein said power splitter includes transmission lines arranged in columns and rows such that said input terminal is coupled to a center point of a first one of said columns, said first and second output terminals defining end points of a second one of said columns, and said isolation terminal is centrally located between said end points of said second column;

a first transmission path coupled to said first output terminal;

a second transmission path coupled to said second output terminal, said second transmission path imposing an approximately equal phase lag as said first transmission path; and a push-push amplifier having a first transistor and a first feedback circuit which form a first portion of said push-push amplifier, said amplifier having a second transistor and a second feedback circuit which form a second portion of said amplifier, and said first portion and said second portion imposing approximately equal phase lags and providing respectively first and second amplified signals, said first and second amplified signals being substantially in-phase.

18. An integrated wide bandwidth frequency multiplier for multiplying a first frequency of an input signal to generate an output signal quadruple in frequency of said input signal, said multiplier comprising:

a first stage lumped element power splitter having an input terminal configured to receive said input signal and having first and second output terminals, and an isolation terminal, said power splitter including transmission lines arranged in columns and rows on a semiconductor substrate, said input terminal being located at a center point of a first one of said columns, said first and second output terminals defining end points of a second one of said columns, said isolation terminal being centrally located between said end points of said second column, and said power splitter being configured to split said input signal to provide first and second signals that are substantially one hundred and eighty degrees out of phase;

a first transmission path coupled to said first output terminal, said first transmission path imposing a first phase lag on said first signal;

a second transmission path coupled to said second output terminal, said second transmission path imposing a second phase lag on said second signal, wherein said first and second transmission paths have substantially equal lengths such that said first and second phase lags are approximately equal;

a first stage push-push amplifier having first and second amplifier inputs, said first amplifier input being coupled to said first transmission path for receiving said first signal, said second amplifier input coupled to said second transmission path for receiving said second signal, and said first stage push-push amplifier having first and second outputs configured to produce first and second amplified signals;

a first stage combining junction coupled to said first and second push-push amplifier outputs and configured to combine said first and second amplified signals to generate an intermediate signal double in frequency of said input signal;

a second stage lumped element power splitter having a second stage input terminal coupled to said first stage combining junction and having fourth, fifth, and sixth output terminals, said second stage input terminal being configured to receive said intermediate signal, said second stage power splitter including transmission lines arranged in said columns and rows on said semiconductor substrate, said second stage input terminal being located at a center point of a third one of said columns, said fourth and fifth output terminals defining end points of a fourth one of said columns, said sixth output terminal being centrally located between said end points of said fourth column, and said second stage power splitter being configured to split said intermediate signal to provide third and fourth signals that are substantially one hundred and eighty degrees out of phase;

a third transmission path coupled to said fourth output terminal, said third transmission path imposing a third phase lag on said third signal;

a fourth transmission path coupled to said fifth output terminal, said fourth transmission path imposing a fourth phase lag on said fourth signal, wherein said third and fourth transmission paths have substantially equal lengths such that said third and fourth phase lags are approximately equal;

a second stage push-push amplifier having third and fourth amplifier inputs, said third amplifier input coupled to said third transmission path for receiving said third signal, said fourth amplifier input coupled to said fourth transmission path for receiving said fourth signal, said second stage push-push amplifier having third and fourth outputs configured to produce third and fourth amplified signals; and a second stage combining junction coupled to said third and fourth push-push amplifier outputs and configured to combine said third and fourth amplified signals in phase to generate said output signal quadruple in frequency of said input signal.

19. An integrated wide bandwidth frequency multiplier as claimed in claim 18 wherein said multiplier is integrated on a single microwave monolithic integrated circuit.

20. A multiplier for generating an output signal having a second frequency from an input signal having a first frequency, said multiplier comprising:

a power splitter having high and low pass sections for splitting said input signal into first and second signals, respectively that are substantially one hundred and eighty degrees out of phase;

a first transmission path for imposing a first phase lag on said first signal;

a second transmission path for imposing a second phase lag on said second signal, wherein said first and second transmission paths have substantially equal lengths such that said first and second phase lags are approximately equal;

a push-push type amplifier for amplifying said first and second signals to produce respectively first and second amplified signals, said first and second amplified signals being substantially in-phase; and a combiner for in-phase combining said first and second amplified signals to generate said output signal having said second frequency.

21. A multiplier as claimed in claim 20 wherein the high pass section attenuates low frequency portions of the input signal and the low pass section attenuates high frequency portions of the input signal.

* * * * *

UNITED STATES PATENT AND TRADEMARK OFFICE
CERTIFICATE OF CORRECTION

PATENT NO.    : 6,124,742
DATED         : September 26, 2000
INVENTOR(S)   : Dean Cook and Christopher D. Grondahl It is certified that error appears in the above-identified patent and that said Letters Patent is hereby corrected as shown below:

<u>Column 9,</u>
Line 38, delete "1" and replace with -- 3 --.

Signed and Sealed this

Eleventh Day of June, 2002

Attest:

Attesting Officer

JAMES E. ROGAN
*Director of the United States Patent and Trademark Office*